United States Patent [19]

Eirikasson

[11] Patent Number: 5,081,601
[45] Date of Patent: Jan. 14, 1992

[54] SYSTEM FOR COMBINING INDEPENDENTLY CLOCKED SIMULATORS

[75] Inventor: Asgeir T. Eirikasson, Los Gatos, Calif.

[73] Assignee: LSI Logic Corporation, Milpitas, Calif.

[21] Appl. No.: 411,291

[22] Filed: Sep. 22, 1989

[51] Int. Cl.$^5$ .............................................. G06F 15/16
[52] U.S. Cl. .................................................... 364/578
[58] Field of Search ............... 364/578, 488, 489, 200, 364/900, 569; 371/23

[56] References Cited

U.S. PATENT DOCUMENTS

| | | | |
|---|---|---|---|
| 4,751,637 | 6/1988 | Catlin | 364/200 |
| 4,763,289 | 8/1988 | Barzilai et al. | 364/578 |
| 4,787,061 | 11/1988 | Nei et al. | 371/23 |
| 4,787,062 | 11/1988 | Nei et al. | 371/23 |
| 4,866,663 | 9/1989 | Griffin | 364/578 |
| 4,873,656 | 10/1989 | Catlin | 364/578 |
| 4,901,260 | 2/1990 | Lubachevsky | 364/578 |
| 4,918,394 | 4/1990 | OLnizuka | 364/578 |
| 4,918,652 | 4/1990 | Bennington et al. | 364/578 |

OTHER PUBLICATIONS

Arnout et al; "The Use of Threshold Functions and Boolean-Controlled Network Elements for Macromodeling of LSI Circuits"; IEEE 1978.

Menzel et al; "A Multilevel Simulation for MOS VLSI Networks"; IEEE 1989.

Chadha et al.; "M$^3$-A Multi-Level Mixed-Mode Simulator"; IEE Conference on Computer-Aided Design 1988.

Sampson; "An Ideal Mixed-Mode Simulator" VLSI System Design 1988.

Primary Examiner—Parshotam S. Lall
Assistant Examiner—Ellis B. Ramirez
Attorney, Agent, or Firm—Skjerven, Morrill, MacPherson, Franklin & Friel

[57] ABSTRACT

Two or more independently clocked simulators are interconnected in a manner which prevents signal exchange at a time when the internal simulation clocks of the simulators point to different times on a simulated time line. Each simulator transmits to one or more of the other simulators in its network information indicaitng the next point in simulated time at which the transmitting simulator can model a state change which might affect a model part being simulated by the receiving simulator. Blocking means are provided for blocking the receiving simulator from advancing its simulated time clock ahead of the next state change time of the transmitting simulator. The receiving simulator is free, however, to operate at its maximum speed for simulated time spans occurring before the next state change time of the transmitting simulator.

9 Claims, 12 Drawing Sheets

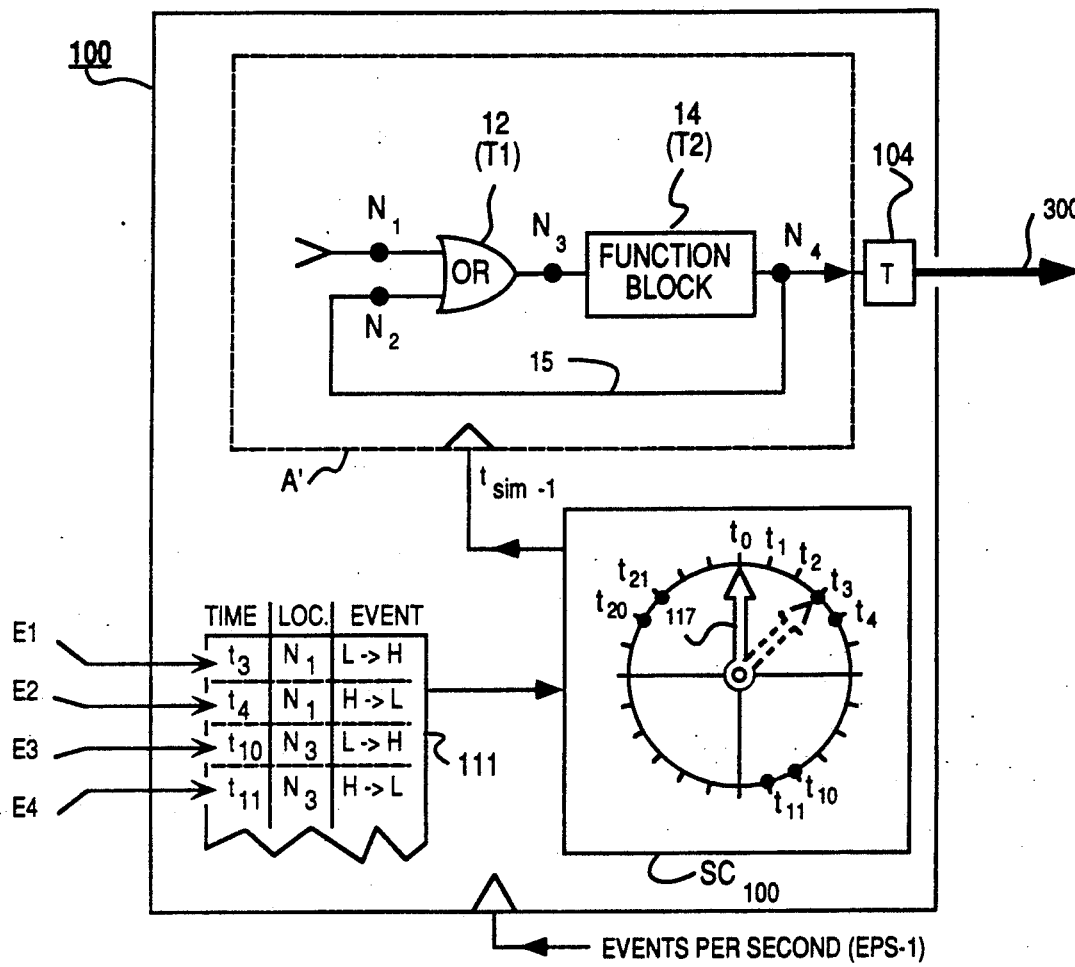
FIGURE 2A (1)
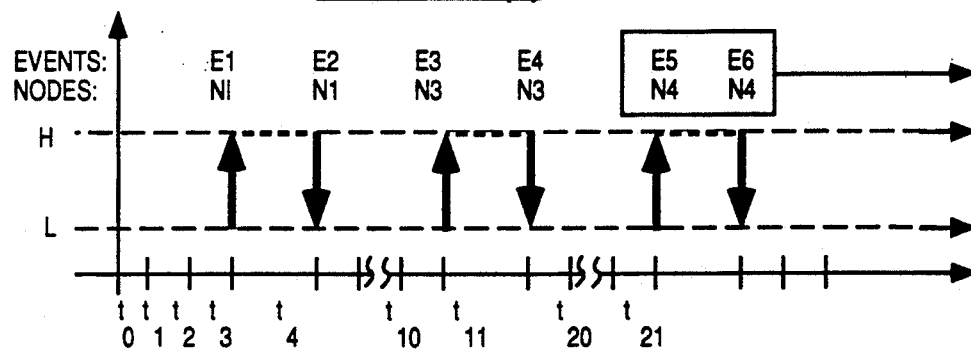
FIGURE 2B (1)

FIGURE 2A (2)
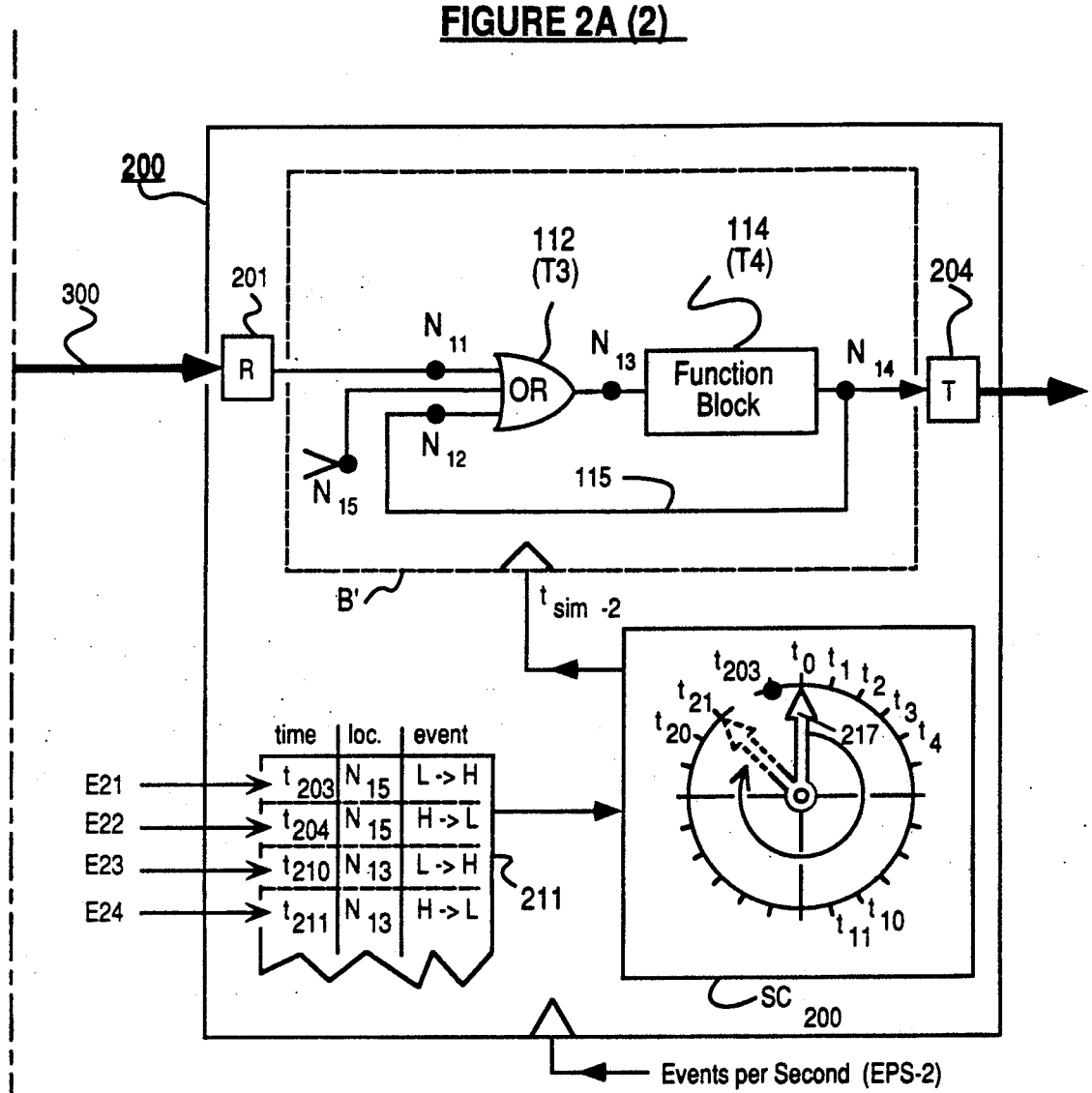
FIGURE 2B (2)
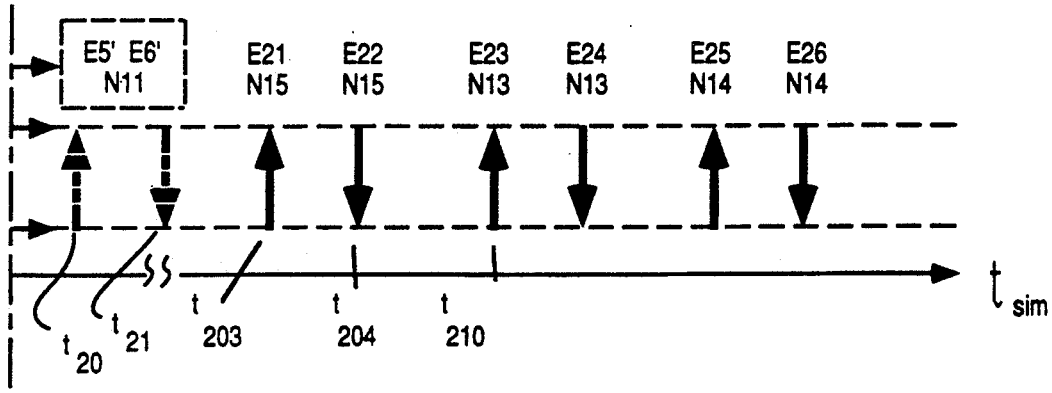

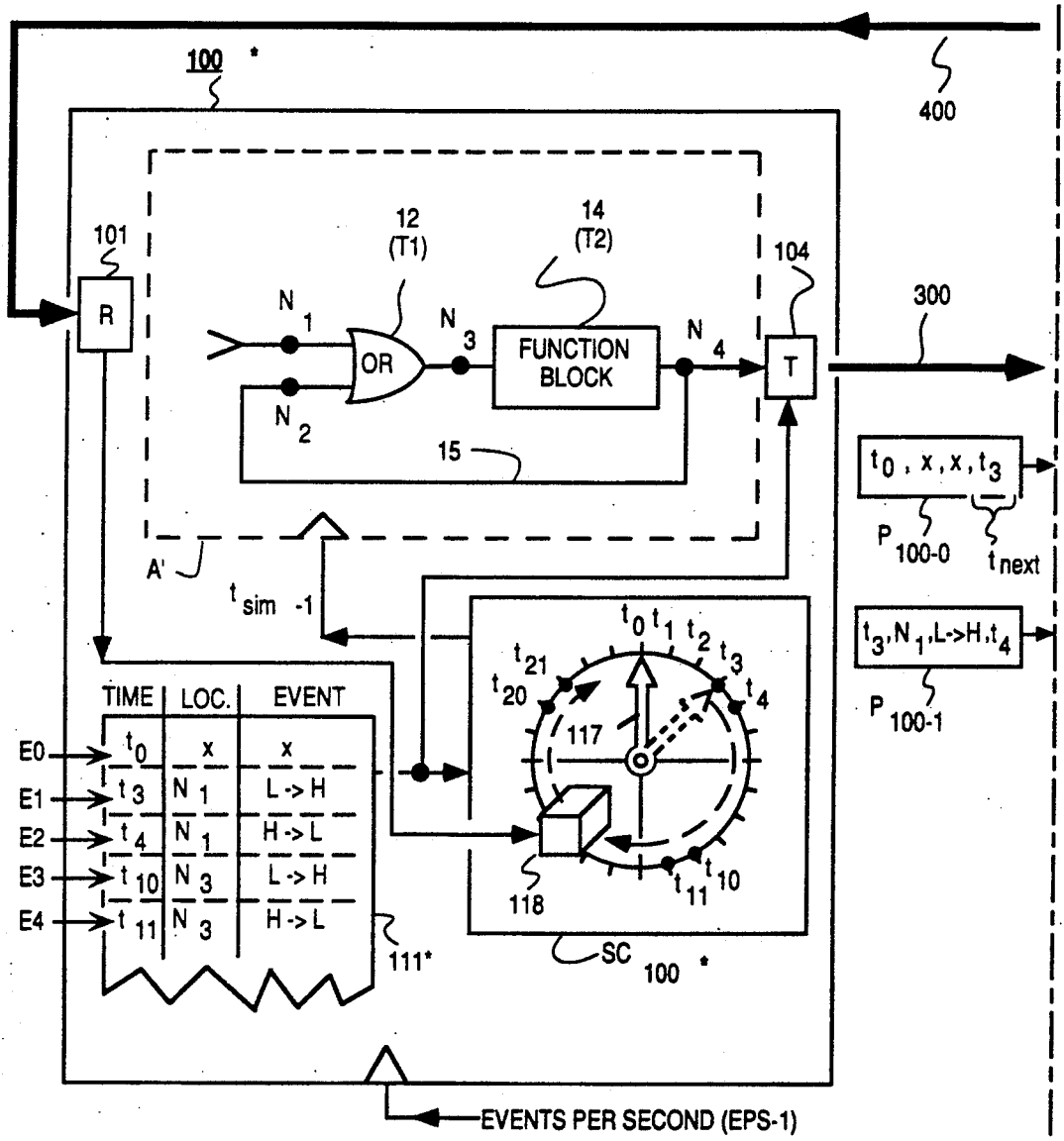

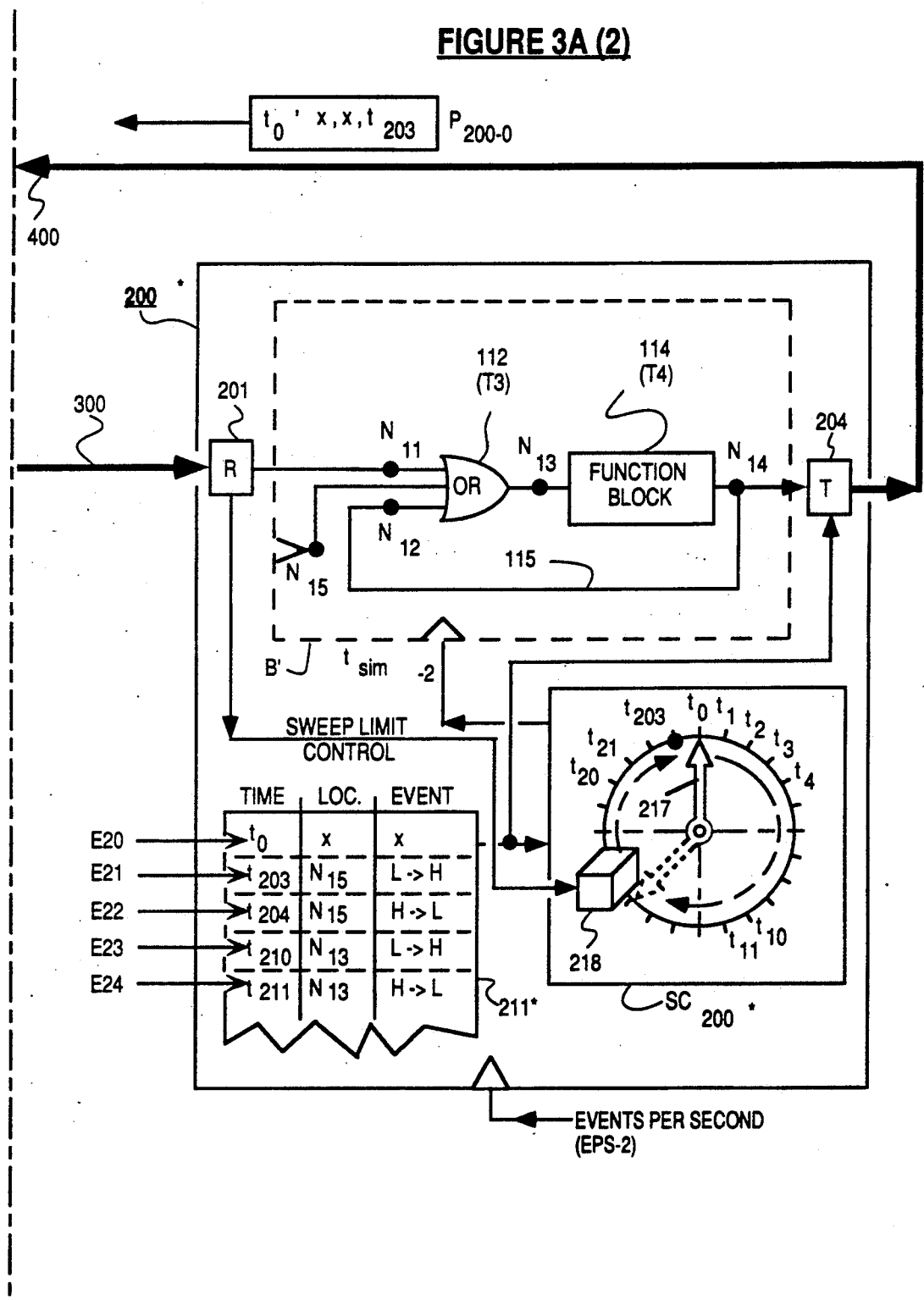
FIGURE 3A (2)

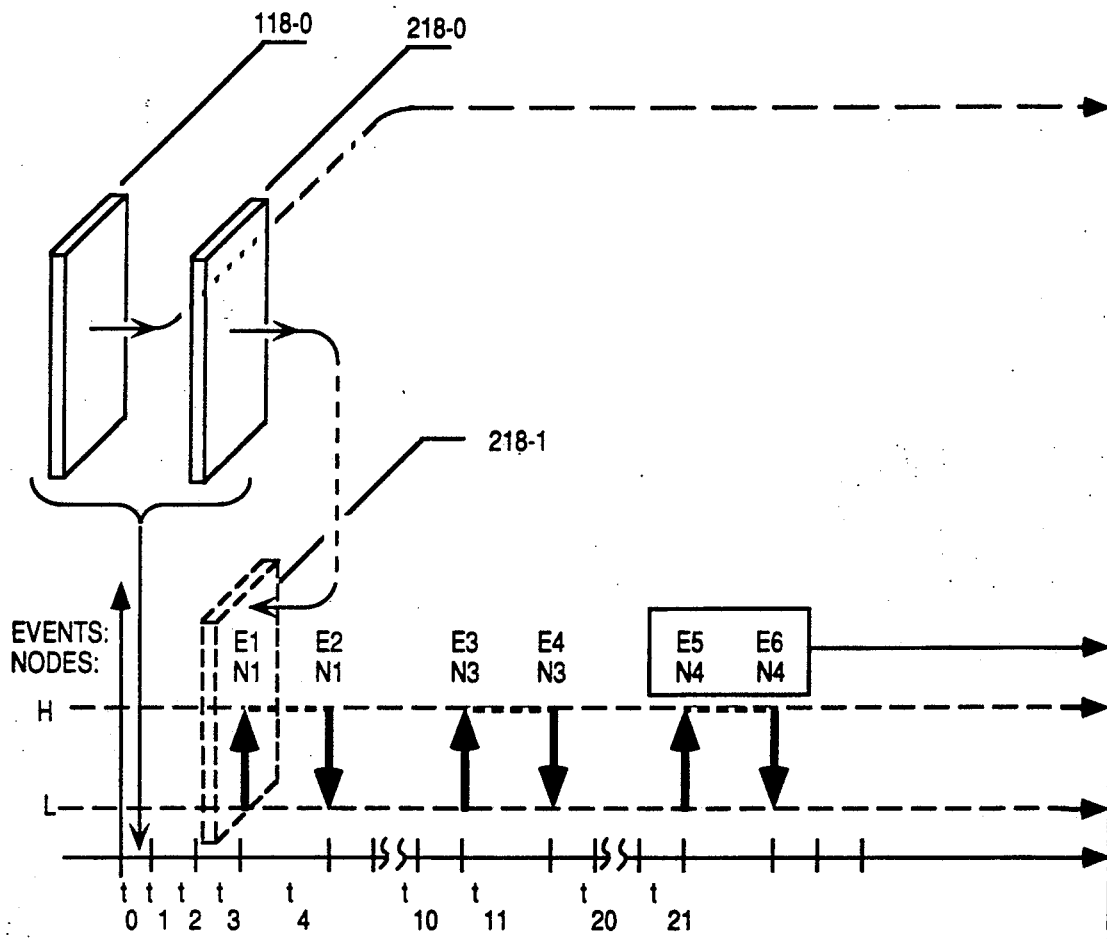

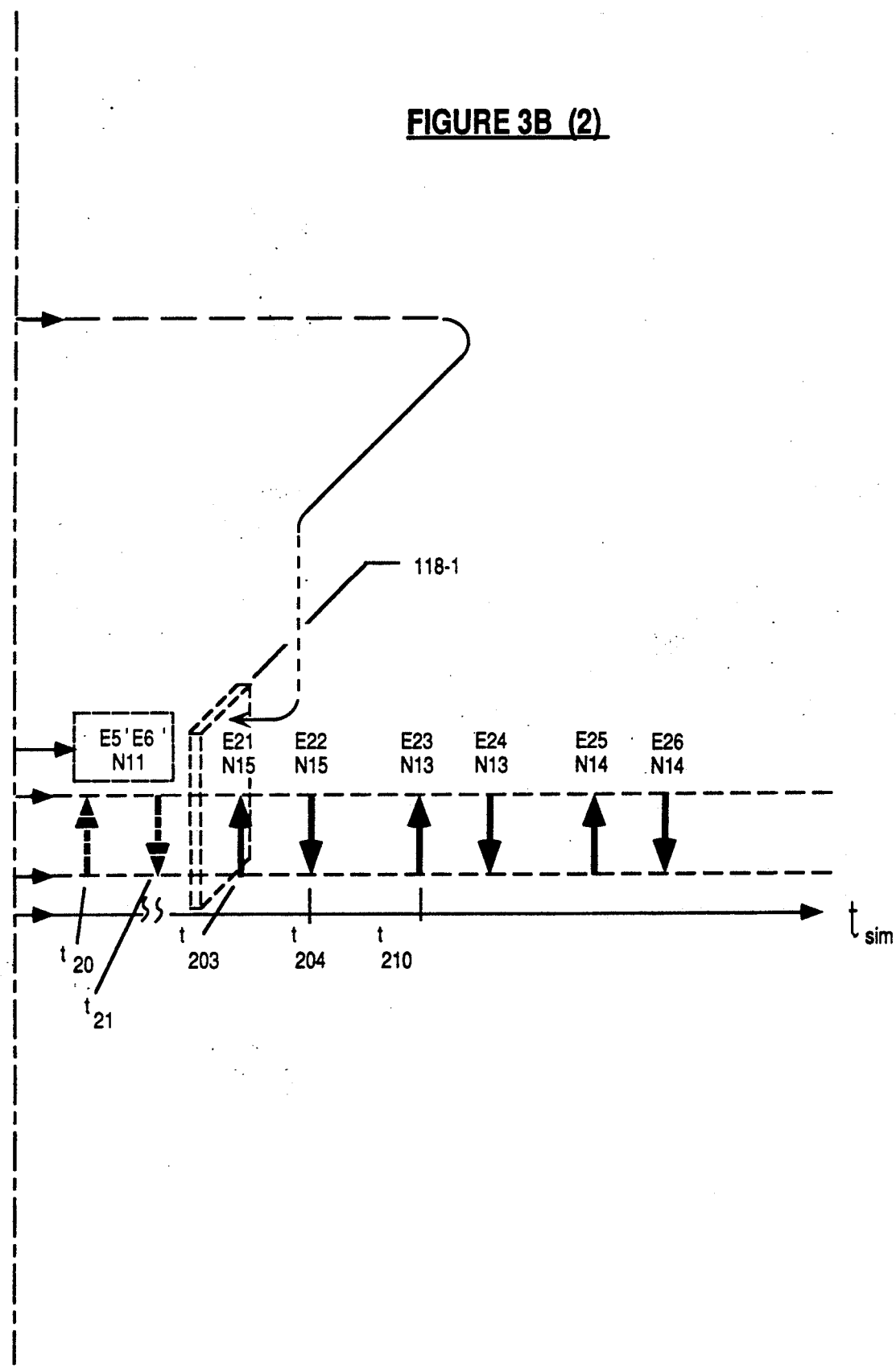

SYSTEM FOR COMBINING INDEPENDENTLY CLOCKED SIMULATORS

BACKGROUND OF THE INVENTION

1. Field of the Invention

The present invention is directed generally to the problem of interconnecting independently clocked simulators and more particularly to the interconnection of event driven simulators.

2. Description of the Relevant Art

Simulators enable engineers to model and test designs (i.e. electronic circuit schematics) before such designs are implemented in tangible (i.e., hardware) form. Various levels of definitional detail may be utilized to model the designed structure. By way of example, models of digital processing units may be defined at one or more of a behavioral level, a logic gate level and a transistor level. Each level of definitional detail has its unique idiosyncrasies with respect to the actual speed at which simulation of the model will run, the size of memory needed for creating the model on a specific data processing machine, the accuracy of the model in simulating the end product, and so forth.

It is generally found that if a simulator is optimized to operate at maximum speed and/or maximum efficiency in one definitional level (i.e., gate level), it will not operate as efficiently in simulating designs at other modeling levels (i.e., behavioral level). Accordingly, it is desirable from the price versus performance viewpoint to build a level-specific simulator which is optimized for modeling at one specific level (i.e., the gate level) rather than to attempt the building of a generic simulator that will on average become optimized for all levels of modeling (i.e., both gate and behavioral levels) but will fail to provide peak performance for the computationally most demanding of the definitional levels.

By way of a first example of this phenomenon, there is an event-driven simulator, commercially available from Ikos Systems Inc. of Sunnyvale, Calif., which is optimized for modeling structures at the gate level, and no other level. Similarly, as a second example, there is a gate level optimized simulation engine known as AcceLSI ™ which is available from LSI Logic Inc. of Milpitas, Calif. The structure of the IKOS engine is disclosed in U.S. Pat. No. 4,787,061, "Duel Delay Mode Pipelined Logic Simulator" issued Nov. 22, 1988 to Nei et al., the disclosure of said patent being incorporated here by reference.

While the Ikos engine is efficient in preforming gate level simulation, it does not include means for simulation at the behavioral level. To overcome this drawback, designers use a so-called "B-sim" mixed level simulator available from LSI Logic of Milpitas, Calif. under the trade name MBSIM ™, for performing mixed level simulation. The B-sim engine is optimized primarily for behavioral level simulation but it can perform simulation at other levels although not with the same speed or efficiency as that of a simulator which is level specific, i.e., an Ikos engine which provides only gate level simulation. Thus, when a design is to be modeled entirely at the gate level, it is preferable to use the Ikos engine rather than the B-sim engine; and when a design is to be modeled entirely at the behavioral level, it is preferable to use the B-sim engine. When a design includes both behavioral and gate level parts, the mixed level simulator mode of the B-sim engine is used but simulation speed and efficient utilization of resources is lost as more and more of the model is converted from behavioral level to gate level. Heretofore, a simple method for maximizing simulation speed and extracting peak efficiency from available resources has not been available for mixed level simulation. The invention disclosed herein seeks to overcome this problem.

Aside from the problem posed by mixed level simulation, there is also present in the industry the problem of compatibility between the software libraries of different simulators. It should be understood that in addition to the above-mentioned Ikos and LSI Logic B-sim simulators, there are other simulators available from different vendors and that these other machines can be structured differently both hardware-wise and software-wise. By way of further examples, Zycad Corporation of St. Paul, Minn. provides an event driven simulator such as disclosed in U.S. Pat. No. 4,769,817 issued Sept. 6, 1989 to Krohn et al., the disclosure of said patent being incorporated herein by reference. Another simulator is disclosed in U.S. Pat. No. 4,527,249, "Simulator System For Logic Design Validation" issued July 2, 1985 to Van Brunt, the disclosure of said patent being also incorporated herein by reference.

The different simulators of different vendors generally require incompatible software input files for modeling a particular piece of hardware. If an exchange of model parts between the libraries of different simulators is contemplated, such an exchange typically calls for substantial modification to the model defining software contained in the source library before it can be ported to a new simulator. Accordingly, when a first library of software descriptions has already been developed on a first type of simulator for a first set of model parts and a designer wishes to perform a simulation including the first set of model parts on a second type of simulator whose library contains a second, different set of model parts, such a switch over to a new simulator (porting) requires substantial work to convert the input files of the first simulator to match the compatibility requirements of the second simulator. As the number and/or complexity of the model parts grows, an ever increasing danger is created that bugs (flaws) will be introduced into the model definitions when they are ported from one simulator to the next.

Because of this danger, there is a long-felt but unfulfilled desire in the industry to be able to share model parts developed on a first simulator with a simulation being run on a second simulator without having to port the model definitions of the first simulator over to the second simulator. Especially during the initial development of a new design, it is often desirable to construct the overall design definition from model parts whose individual definitions have already been developed on different simulators. It would be highly advantageous to be able to interconnect the pre-defined model parts of such different simulators so that the software definition of each model part can continue to reside during simulation in the simulator of its origin. This would avoid the time, cost and bug-introducing dangers associated with converting the definitions of the different model parts into a common form and/or porting them all into a universally compatible simulator. The invention disclosed herein seeks to overcome these problems.

Besides the problem of porting designs from one simulator to another, it is at times advantageous to model one part of an overall design at a first level of definitional detail, i.e., the gate level, and another part at a second level of detail, i.e., the behavioral level, and to study interactions between the first and second level parts.

Under all of the above mentioned situations (porting designs and simulating with mixed levels) it would be desirable, from the price/performance standpoint, to be able to devise a cross-coupled combination of simulators wherein each simulator is specifically optimized for a different level of modeling (i.e., transistor, gate or behavioral) and/or a different model-part providing library, and wherein the level-specific or library-specific simulators are operatively interconnected to one another such that each harmoniously simulates its corresponding part of the overall design at its own peak speed and/or maximum resource-utilization efficiency and such that error-free modelling of the overall design takes place.

Unfortunately, because each individual simulator is independently clocked in such a combination, a synchronization problem arises. When different level-specific or library-specific simulators are operating concurrently (by multitasking in one computer or by parallel processing in multiple CPU's), the simulated time clock of one simulator may become unsynchronized with the simulated time clock of another simulator. One simulator (i.e., a gate level specific simulator) might be running its part of the design across simulated time at a relatively high speed while another simulator (i.e., a behavioral level specific simulator) might be running its part of the design across simulated time at relatively slow speed, the difference in speed arising from limitations inherent to the operations of the differently optimized simulators. As such, when the model part of the faster simulator needs to send a signal to the model part of the slower simulator or needs to receive a signal from the slower simulator part, some means should be provided for synchronizing the model part of the faster simulator with the model part of the slower simulator so that they are at a common point on the simulated time line when signal exchanges are to take place.

Lock-stepping the clock of a faster simulator with the clock of a slower simulator tends to destroy the price/performance advantage of the faster simulator since the faster machine is forced to always operate at the speed of the slower simulator. Thus, lock-stepping is not a commercially viable solution. It is preferable to be able to somehow maintain the peak performance/price ratio of the high speed simulators, even if only over short bursts of time, rather than forcing the high speed simulators to continuously operate at slow speed. If the latter is done, the resources of the high speed simulators can be used to support in a time-shared manner other simulations having additional model parts that are supported on other slow speed simulators when the resources of the high speed simulators are not needed by a first simulation. The invention disclosed here makes possible such resource distribution.

From the perspective of minimizing actual time spent performing a simulation, it is further desirable to enable the interconnection of model parts which are supported on two or more so-called "event-driven" simulators. Preferably, the individual event-driven simulators are each optimized for operation at a different level of modeling or for operation with a different software library.

Heretofore, there was no clear way of maintaining the peak performance/price ratio of independently clocked simulators. There was no suitable method for making sure that an event list (event-queue) in a first event-driven simulator will be synchronized in the simulated time domain with the event list of a second, independently-clocked event-driven simulator. The invention disclosed here provides a method and system architecture for realizing these goals.

SUMMARY OF THE INVENTION

It is an object of the present invention to provide a method and apparatus by which independently clocked simulators may be synchronized without substantially interfering with the maximum running speed of each simulator.

In accordance with the invention, a network of interconnected simulators is provided wherein each simulator transmits to other simulators of the network, information indicating the next known point in simulated time at which the transmitting simulator can generate in its local model part a state change which could affect the model parts of the receiving simulators. Blocking means are provided in each receiving simulator for blocking the receiving simulator from advancing its simulated time clock beyond the next time point of the transmitting simulator. Each receiving simulator is free, however, to advance its respective clock at peak speed over time spans in the simulated time domain which are located before the next time point of the transmitting simulator. Thus, synchronization is maintained without limiting the simulation speed of the interconnected simulators.

BRIEF DESCRIPTION OF THE DRAWINGS

FIG. 2A is a block diagram (extending left to right respectively across sheets 2.1 and 2.2) for explaining a synchronization problem which arises when an attempt is made to interconnect independently clocked simulators.

FIG. 2B is a plot of simulated time (extending left to right respectively across sheets 2.1 and 2.2) for explaining the synchronization problem of FIG. 2A.

FIG. 3A is a block diagram (extending left to right respectively across sheets 3a.1 and 3a.2) for explaining a synchronization scheme in accordance with the invention.

FIG. 3B is a plot of simulated time (extending left to right, respectively, across sheets 3b.1 and 3b.2) for explaining the synchronization scheme shown in FIG. 3A.

DETAILED DESCRIPTION OF THE PREFERRED EMBODIMENTS

Figure 1A:
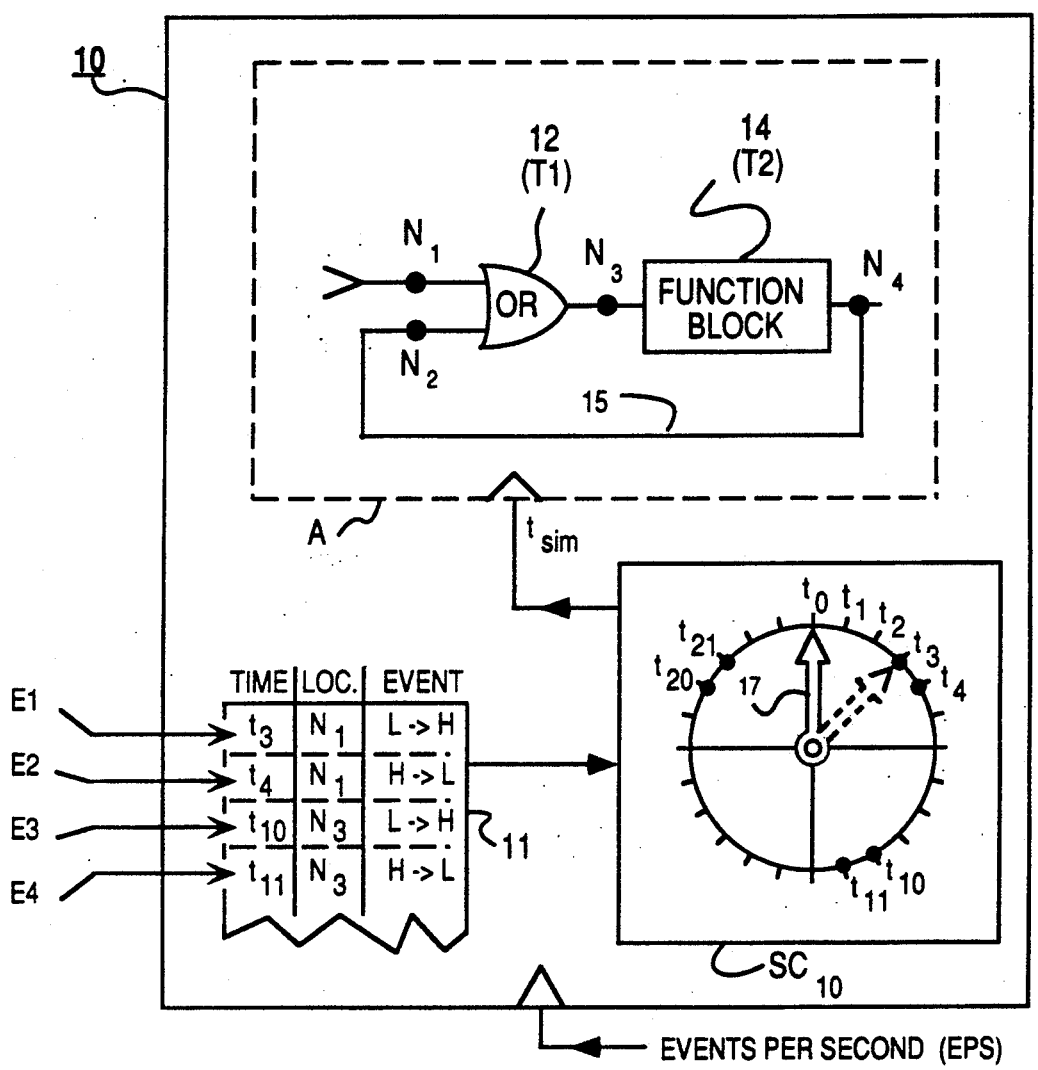
FIG. 1A is a block diagram for explaining the operation of an event driven simulator.

The following is a detailed description of the best modes presently contemplated by the inventor for carrying out the invention. It is to be understood that this description is merely exemplary of the invention and is not to be taken in a limiting sense.

Event driven logic simulators, whether implemented in software or hardware, are a type of simulator in which dynamic state changes occurring within a model are defined as a series of discrete "events" each attributed to a point on a simulated time line and to an identifiable part of the model being simulated. Segments of simulated time that are occupied by static modes of operation in the model are skipped over in order to minimize actual computer time spent for simulation. The only information that is generally processed by the simulation-supporting computer is that indicating the occurrence of a change in state within the model at a definable point along the simulated time line and that identifying the location (i.e., node) in the model where the change occurs.

During event-driven simulation, the events within a model are each temporarily posted onto an event queue (or event list), each event being represented by a corresponding piece of event data. The event data usually defines a net point (node location), a time parameter (event time), and a new state for the net point. The event queue contents are dynamically updated when the simulator determines that the consequences of a first event are to result in the production of a second event not previously posted on the event queue. Events which have already been processed (evaluated) are dynamically removed from the event queue (also sometimes referred to as a "timing wheel").

To better understand the above discussion with respect to how dynamic addition and removal of event data from a queue takes place, let it be assumed that there is a model having a first net point (node) which serves as the input terminal of a first driven device, that an output terminal of the first driven device is coupled to a second net point and the second net point serves in turn as the input terminal of a second driven device whose output terminal is coupled to a third net point, and so on. If a step pulse is applied to the first net point at time zero (input event), there will be a response at the second net point, then at the third net point and the effects of the input pulse will thus ripple through the model. Since each driven device generally has a cause and effect type of time delay (signal propagation delay) attributed to its operation, the output state of each device changes at a simulated point in time spaced apart from that of the input event. There is no need to spend actual time for processing simulated time between the input event and the output event because nothing of interest happens between events. This is the paradigm by which event driven simulators minimize their actual time for modeling. The response of each driven device to an input event is not posted until the actual time when its specific input event is evaluated. Thus, responses at the front of a signal propagation chain are first to be posted on the queue and responses at the end of a chain are last to be posted on the queue. Once an event is processed, it is cleared from the queue and the time gap to the next listed event is in essence, automatically skipped. This helps minimize the size of the queue and the time of simulation. The event-driven simulator keeps track only of the current state of the model being simulated and has no knowledge of previous or future states.

Referring to the block diagram of FIG. 1A, there is shown an event driven simulator 10 for modeling a digital circuit A. The circuit A, which is merely exemplary, comprises an OR gate 12 having a first signal propagation delay, T1, and a logical function block 14 having a second signal propagation delay, T2. Nodes $N_1$ and $N_2$ define input terminals of the OR gate 12 while node $N_3$ is common to the output terminal of the OR gate 12 and an input terminal of the function block 14. Node $N_4$ defines the output terminal of the function block 14 which is coupled by way of a feedback line 15 to input node $N_2$ of the OR gate 12.

Figure 1B:
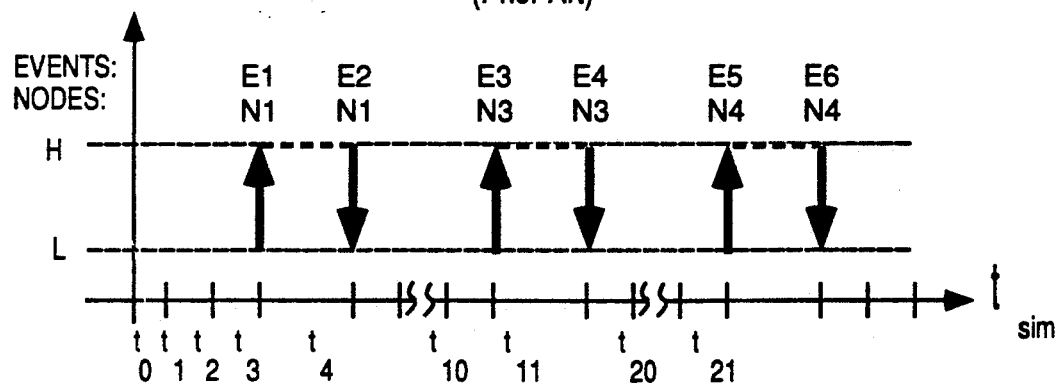
FIG. 1B is a plot of a simulated time line having events distributed among various ones of its time points for explaining the operation of the simulator shown in FIG. 1A.

Referring further to the plot of simulated time, $t_{sim}$, shown in FIG. 1B, let it be assumed that the circuit A is initialized prior to a start time $t_0$ to have all of its nodes, $N_1$ through $N_4$ set to a logic low (L). Further, assume that an event queue 11 of the simulator 10 is primed to contain a first entry, $E_1$, indicating that at simulated time $t_3$ (i.e., three simulated clock ticks after start time $t_0$) a logic high (H) is to be applied to input node $N_1$ and a second entry, $E_2$, indicating that a logic low (L) is to be applied to input node $N_1$ at time $t_4$. No other events are posted on the event list 11 at this time.

When the simulation is started, the simulator 10 automatically searches its event list (queue) 11 for the earliest event and thereby automatically sweeps the (hypothetical) hand 17 of its time simulating clock, $SC_{10}$, past all previous time points, i.e., $t_0$, $t_1$ and $t_2$, not listed on the event queue 11.

Input node $N_1$ is set to a logic H state when the first entry $E_1$ is processed. The simulator 10 then looks at each device in the circuit A having a terminal that is operatively driven by the changed first node $N_1$ (i.e., the OR gate 12). Next, the simulator 10 determines whether and when the state of any node coupled to the driven device (OR gate 12) will change as a next immediate result of the first event $E_1$. In this case, because the OR gate 12 now has a logic high (H) applied to its input node $N_1$ and because the OR gate 12 has a signal propagation delay T1, which for the sake of example here will be assumed to be seven time units wide, a new third entry $E_3$ (which was not listed in the queue beforehand) is dynamically posted onto the event queue 11 indicating that at time $t_{10}$ (seven simulated clocks ticks after $t_3$), node $N_3$ (the output terminal of OR gate 12) will be set to a logic high (H). The first entry $E_1$, having been processed, is then cleared off the event queue 11 and only the second and third events $E_2$ and $E_3$ are now posted.

The system event clock $SC_{10}$ is next skipped forward in a single step from simulated time point $t_3$ to time point $t_4$, this being the next simulated time point listed on the event queue 11. The cycle then repeats with the simulator 10 looking at all devices coupled to the changed node (i.e. $N_1$) of the new event $E_2$.

Referring to FIG. 1B, it can be seen that the above described first and second events, $E_1$ and $E_2$, in essence define an input pulse at node $N_1$; the dynamically posted third and fourth events $E_3$ and $E_4$ define the $T_1$ delayed output pulse signal of OR gate 12; and later posted events $E_5$ and $E_6$ define a $T_2$ delayed output pulse of function block 12. The example given in FIG. 1B establishes an oscillation in circuit A since the output pulse ($E_5$ and $E_6$) of block 14 becomes a new input pulse at input node $N_2$ of the OR gate 12 and new events, i.e., $E_7$, $E_8$, . . . (not shown), will continue to be dynamically posted on the event queue 11 as the simulation runs.

Referring back to FIG. 1A, it will be noted that the internal structure of function block 14 has been left undefined. This was done intentionally so that FIG. 1A can represent either of a gate level or behavioral level model. It should be apparent that in a case where the internal structure of function block 14 is defined entirely at a gate level that the simulator 10 will be preferably chosen as one optimized for operation at the gate level (i.e., an Ikos engine) in order to minimize the amount of actual time needed to simulate circuit A. On the other hand, if the internal structure of function block 14 is defined mostly at a behavioral level, the simulator 10 should be one optimized for behavioral level operation (i.e., a B-sim engine). The actual rate of simulation, as performed by the simulator 10 is defined in terms of events per second (EPS), and this rate can vary drastically depending on the model type (gate level or behavioral level) and the efficiency of the chosen simulator 10. By way of example, the LSI MBSIM ™ engine performs gate level simulation at a rate of approximately 8,000 EPS while an Ikos or Zycad engine performs gate level simulation at a rate of 300,000 EPS or better.

Referring to FIG. 2A, which is a schematic drawing extending left to right across respective sheets 2.1 and 2.2, let it be assumed that there are two circuit parts, A' and B', each similar in topology to the circuit A of FIG. 1A. Like references denote like parts. Let it be assumed further with respect to FIG. 2A that circuit parts A' and B' are to be operatively coupled to one another such that they share at least one common component (in this case, node $N_4$ is to be directly tied to node $N_{11}$) Moreover, let it be assumed that one circuit part, i.e., A', is defined entirely at the gate level and that the other circuit part, i.e., B', is defined primarily at the behavioral level. It should be apparent from the above discussion that two different simulators, 100 and 200, will be needed to optimize the price/performance ratio of the overall simulation environment (first simulator 100, second simulator 200 and an inter-simulator communication link 300).

However, it will be quickly seen that when two or more event-driven simulators are used, the dynamic updating of their individual event queues becomes a problem. In FIG. 2A, circuit part B' is shown to contain nodes $N_{11}$ through $N_{14}$, a three-input OR gate 112 having a third signal propagation delay, T3, and a function block 114 having a fourth signal propagation delay, T4. Delay times T3 and T4 can, of course, be different from T1 and T2.

Since we assume that circuit parts A' and B' are being simulated on different and independently clocked simulators 100 and 200, the simulators 100 and 200 will need to include respective transmission and receiving means 104 and 201 (also labeled as "T" and "R") for allowing each simulator to send and receive messages along an inter-simulator communications link 300 so that an event (i.e., $E_5$ at node $N_4$) which is posted on the event list, (111 or 211), of one simulator (100 or 200) can be transferred to the event list (211 or 111) of the other simulator (200 or 100) and nodes can be tied together. Here we are assuming that node $N_4$ of circuit part A' is to be treated as if it were directly coupled to node $N_{11}$ of circuit part B'. Thus, when an event $E_5 = (t_{20}, N_4, L \rightarrow H)$ occurs at node $N_4$, a twin event $E_5' = (t_{20}, N_{11}, L \rightarrow H)$ should occur at node $N_{11}$.

If the simulators 100 and 200 ran at identical simulation speeds (events per second rates, EPS-1 and EPS-2, respectively) and both advanced their respective simulated clocks $SC_{100}$ and $SC_{200}$ simultaneously to identical points along the simulated time line, $t_{sim}$, there would be no synchronization problem. However, when one of respective event queues, 111 and 211, in the individual simulators 100 and 200 is made to contain a different entry, the automatic time skipping feature of the event driven simulators 100 and 200 can produce a loss of synchronization after just a few events have been processed.

By way of example, let it be assumed that at initial time $t_0$ there are only two events, $E1 = (t_3, N_1, L \rightarrow H)$ and $E2 = (t_4, N_1, H \rightarrow L)$ posted on the first event list 111 and only two events $E21 = (t_{203}, N_{15}, L \rightarrow H)$ and $E22 = (t_{204}, N_{15}, H > L)$ posted on the second event list 211. (The events are defined here by listing their event time, location and state change in the recited order.)

When simulation begins, each simulator (100 and 200) begins to automatically process the information on its respective event list (111 and 211). Since the second event list 211 includes as its first event, an event E21 occurring at a time point $t_{203}$ which time point is positioned much later in simulated time then the time points of the events initially posted in the event queue 111 of the first simulator 100, the simulation of model part B' is immediately made to skip forward in simulated time to the later time point $t_{203}$ without waiting for receipt of the event E5 pulse that should appear on its input node $N_{11}$ representing the earlier timed changes at the output node $N_4$ of the first circuit part A'.

As shown in FIG. 2B, events E21 and E22 can establish an oscillatory behavior in the second circuit part B' composed of subsequently posted events E23, E24, E25, E26, .... But such responsive behavior assumes there has been no a prior input signal (H) applied to input node $N_{11}$ of circuit part B'.

It is only after event $E_3$ (FIG. 2B) is dynamically posted onto the event list 111 of the first simulator 100 and subsequently, a consequential event E5 is dynamically posted on the first event list 111, that a change of state is seen to occur at the corresponding output node $N_4$. Ideally, this consequential event $E5 = (t_{20}, N_4, l \rightarrow H)$ at output node $N_4$ should have been posted onto the second event list 211 as a twin event $E5' = (t_{20}, N_{11}, L \rightarrow H)$ well before the initially posted event of the second simulator, $E21 = (t_{203}, N_{15}, L \rightarrow H)$, is processed. However, the second simulator 200 has no way of knowing ahead of time that event E5 will indeed be posted on the first event list 111. So when the event update message $E5' = (t_{20}, N_4, L \rightarrow H)$ is finally available for transmission from the first simulator 100 to the second, the second simulator 200 has already swept its simulated clock hand 217 too far forward in simulated time. Moreover, the second simulator 200 has already removed the initially posted event E21 from its queue, and as a consequence, the overall simulation will be erroneous if allowed to proceed in a blindly automatic manner because the simulated clocks $SC_{100}$ and $SC_{200}$ will not be synchronized ($t_{sim-1} \neq t_{sim-2}$) at the moment of intersimulator signal exchange.

A method is needed for making sure that the clock hand 217 of the second simulation clock $SC_{200}$ does not skip prematurely past those simulated time points (i.e., $t_{20}$ and $t_{21}$) at which there may be events dynamically posted on its event list 211 from an external independently-clocked source (simulator 100).

FIGS. 3A and 3B are respectively a schematic diagram and time plot for explaining how synchronization may be achieved in accordance with the invention. Like references denote components corresponding to those shown in FIGS. 2A and 2B. The respective simulation clocks, $SC_{100^*}$ and $SC_{200^*}$, of simulators 100* and 200* are each equipped with at least one hand sweep limiting block, 118 and 218, for limiting the forward sweeping movement of its respective clock hand, 117 and 217 beyond the next-event time ($t_{next}$) of the other (external) simulator. The respective hand sweep limiting block, 118 or 218, of each simulator, 100 or 200, is advanced in simulated time under the control of one or more external simulators, i.e., under control of a $t_{next}$ signal output from the corresponding external simulator, 200 or 100, as will become understood by the example provided in FIGS. 3A and 3B. It should be understood from the graphic representation of the sweep limiters (118 and 218) that they do not block the advancement of their respective clocks ($SC_{100^*}$ and $SC_{200^*}$) through time spans located prior in simulated time ($t_{sim}$) to the position of the sweep limiters but rather that they only block further advancement of the clock hands (117 and 217). Thus, the clock hands 117 and 217 are free to sweep at their respective maximum speeds before they encounter the blocks 118 and 218.

Referring first to FIG. 3B, upon initialization, both of the simulators, 100* and 200*, respectively, have non-events (NULL events) E0 and E20 posted on their individual event queues together with the initialization pulse information E1, E2, E21 and E22 previously described. No other information is posted at this time. The hand sweep limiters, 118 and 218, are each initially positioned between simulated time points $t_0$ and $t_1$ of their respective simulation clocks, $SC_{100^*}$ and $SC_{200^*}$. This positioning of the hand sweep limiters, 118 and 218, allows each simulator, 100* and 200*, to process an event (or nonevent) which is listed on its event queue if the event has a time parameter less than $t_1$ but blocks the hand (117 or 118) from sweeping further to process later timed events. At the end of processing an event internally, each simulator sends to one or more simulators, external to itself, a signal $t_{next}$ indicating the next posted time parameter of its individual (internal) event queue.

In the illustrated example of FIGS. 3A and 3B, the first simulator 100* initially processes the nonevent E0 of its list 111*, finds that there is no event at any location, but nonetheless sends the time parameter, $t_{next}=t_3$, indicating the time of the next listed event on its event queue 111* to all external simulators; in this case to external simulator 200*. This message sending step may be done by transmitting an initial information packet $P_{100-0}=(t_0, \times, \times, t_3)$ out along the inter-simulator communication link 300. (Here, the "x"'s denote a nonevent at a don't-care location.) Simultaneously (either by parallel-processing or during a time slot assigned to it by a multitasking operating system), the second simulator 200* searches its queue 211*, finds the NULL event E20 as the first posted event and transmits its respective $t_{next}=t_{203}$ parameter in an information packet $P_{200-0}=(t_o, \times, \times, t_{203})$ to the first simulator 100* along inter-simulator communication link 400.

Each external simulator (100* and 200*) reads this last transmitted piece of information, $t_{next}$, as permission to advance a corresponding at least one hand sweep limiter (118 or 218) provided therein as part of its respective simulation clock ($SC_{100^*}$ or $SC_{200^*}$) to a point in time just before the indicated next event (i.e., $t_3$ and $t_{203}$). In this example, the last item, $t_3$, in the initial transmission packet $P_{100-0}$ from the first simulator 100* tells the second simulator 200* that as far as simulator 100* is concerned, simulator 200* is free to move its respective clock hand 217 at whatever speed desired to a point in time just prior to simulated time $t_3$. The last item, $t_{next}=t_{203}$, in the corresponding initial transmission packet $P_{200-0}$ from the second simulator 200* to the first simulator 100*, tells the first simulator 100* that the first simulator is correspondingly free to move its respective clock hand 117 at whatever speed desired to a point in simulated time just prior to simulated time $t_{203}$ in so far as the second simulator 200* is concerned.

Thus, as indicated in FIG. 3B, the first sweep limiting block 118 is moved in one step from an initial position 118-0 just before simulated time $t_1$ to a new position 118-1 just before simulated time point $t_{203}$. The other hand sweep limiting block 218 is concurrently moved in one step from its initial position 218-0 just before time point $t_1$ to a new position 218-1 just before simulated time point $t_3$. This movement of the sweep limiters, 118 and 218, blocks the second simulator 200* from processing the later timed events E21 and E22, even though they might be posted before externally-generated events E5', E6', etc., are posted, but frees the first simulator 100* to process as quickly as it can those events E1 through E4, etc., on its individual event list which occur in simulated time prior to time point $t_{203}$. Simulation in the second simulator 200* is forced to idle until the first simulator 100* advances the second sweep limiter 218 to a simulated time point ahead of an event listed on the event list 211* of the second simulator 200*.

After processing event $E_1$, the first simulator 100* sends a second transmission packet $P_{100-1}=(t_3, N_1, L{\rightarrow}H, t_4)$ to the second simulator 200* to thereby advance the sweep limiter 218 of the second simulator to a point in simulated time just before time $t_4$. When the packet $P_{100-5}=(t_{20}, N_4, H{\rightarrow}L, t_{21})$ of event E5 is finally transmitted to the second simulator 200*, the second simulator 200* is freed to process the corresponding externally-generated event E5' at its node $N_{11}$ but is still prevented from processing the next listed event $E21=(t_{203}, N_{15}, L{\rightarrow}H)$ which continues to be a next posted event on its queue 211*. (E21 is posted before an earlier timed and next-to-be externally generated event, E6' at node $N_{11}$, is posted).

The advantage of the above process becomes obvious if one thinks of the first simulator 100* as being a high speed engine (i.e., an Ikos engine) and the second simulator 200* as being a slower simulator (i.e., a BSIM engine). The faster simulator 100* can zip through all events posted on its queue 111* having parameters between time points $t_0$ and $t_{203}$ at peak speed without having to worry that the external simulator 200* might generate a shared event during that time span. The second simulator 200* cannot generate a shared event within the time span $t_0$ through $t_{202}$ because there is no event having such a time parameter within its event queue 211*.

Figure 4:
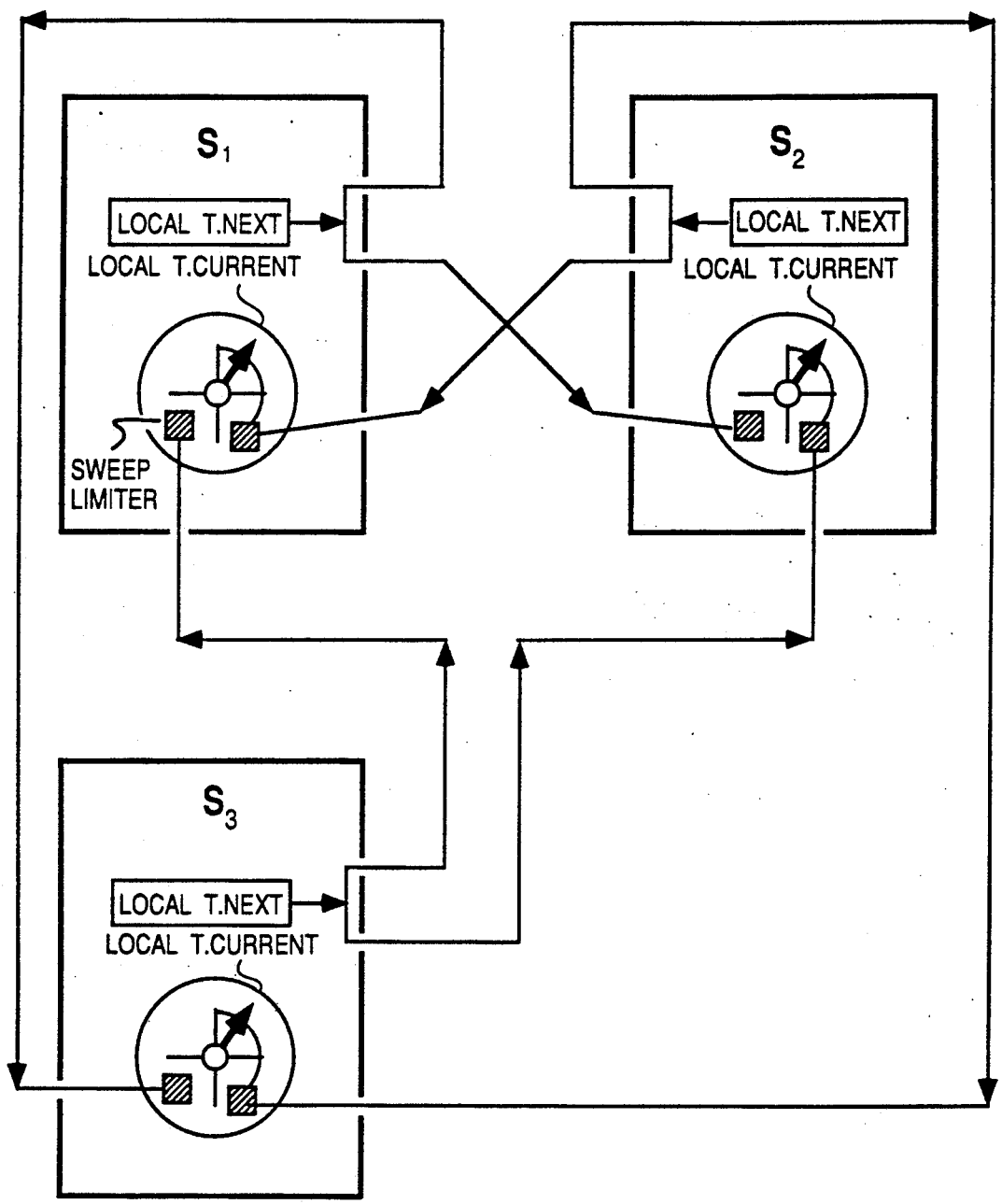
FIG. 4 shows a synchronization scheme for a simulation using more than two simulators.

In a situation where more than two simulators are involved, as shown in FIG. 4, multiple sweep limiters may be provided for the internal clock of each simulator; each of the multiple sweep limiters being advanced by a corresponding one of the external simulators. This arrangement prevents any one simulator from advancing its simulated clock hand (local current time) to a time point beyond the local next event time, t.next, of any of the other, external simulators. In the example shown in FIG. 4, first simulator $S_1$ cannot sweep its current time beyond the local next time of simulator $S_2$. Simulator $S_2$ cannot sweep its local current time beyond the next event time of simulator $S_3$. Simulator $S_3$ cannot advance its local current time beyond the next event time of simulator $S_2$.

It should be noted that the local next event time (t.next) of each simulator is always greater than its current event time. The global next event time of the overall system ($S_1$, $S_2$ and $S_3$ in combination) is the smallest of the local next event times in the simulators $S_1$-$S_3$. With this arrangement, at least one of the simulators $S_1$-$S_3$ should be able to advance its local current time to the global next event time, thereby preventing a lockup of simulation.

Those skilled in the art will appreciate that numerous steps may be taken to minimize simulation time including deletion of redundant information in transmitted information packets and nontransmission of information not needed by a receiving simulator. Accordingly, the exemplary embodiment shown in FIG. 3A may be improved by transmitting in each information packet, i.e., $P_{100-1}$, only one copy of the current time (i.e., $t_3$) only information representing the state changes of nodes that are shared between the transmitting and receiving simulator (i.e., node $N_4$ and $N_{11}$), and finally, the next event time on the timing wheel of the transmitting simulator.

Figure 5A:
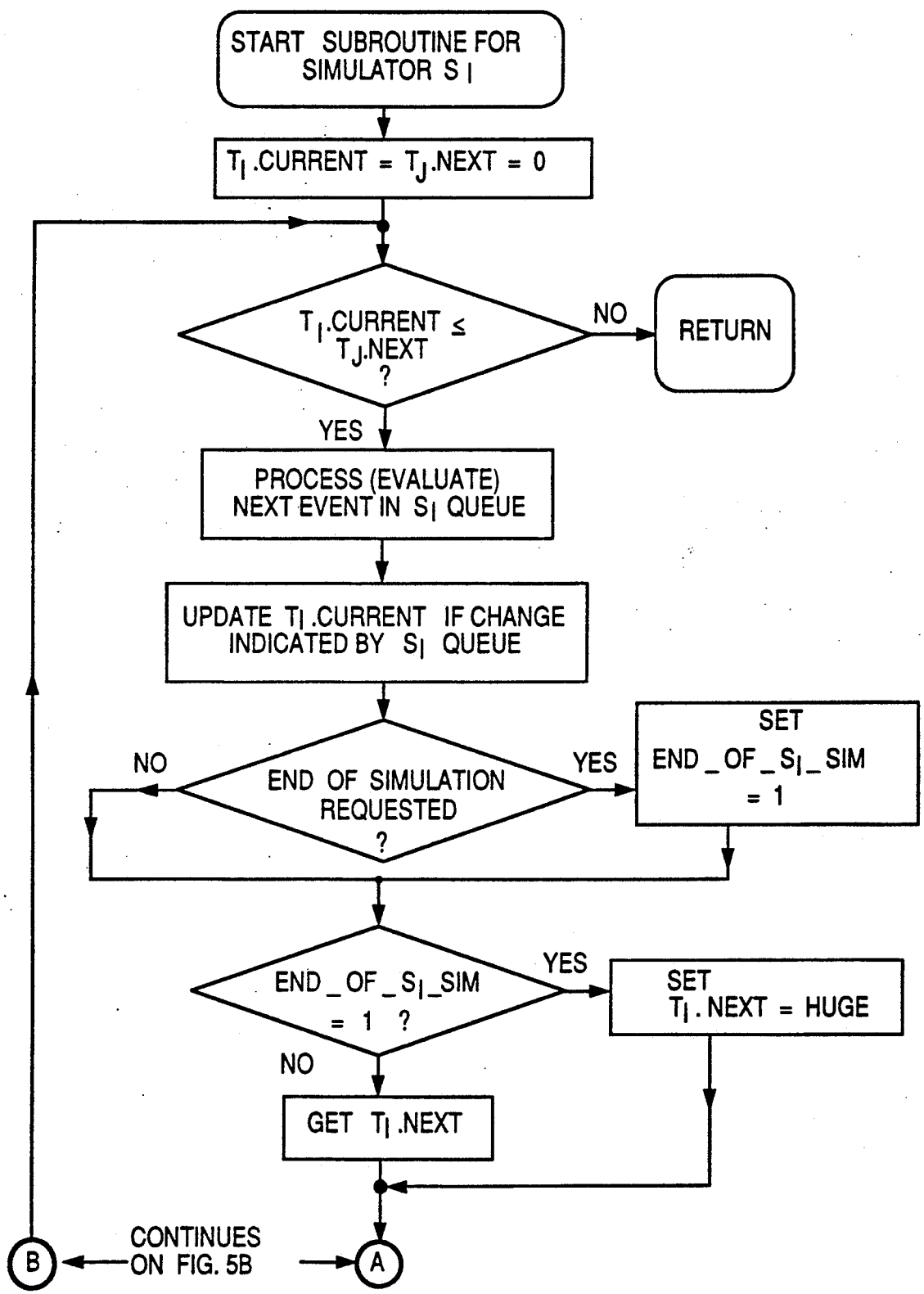
FIGS. 5A and 5B illustrate a flow chart for explaining an algorithm by which synchronization may be achieved without substantially interfering with the speed of each simulator.
Figure 5B:
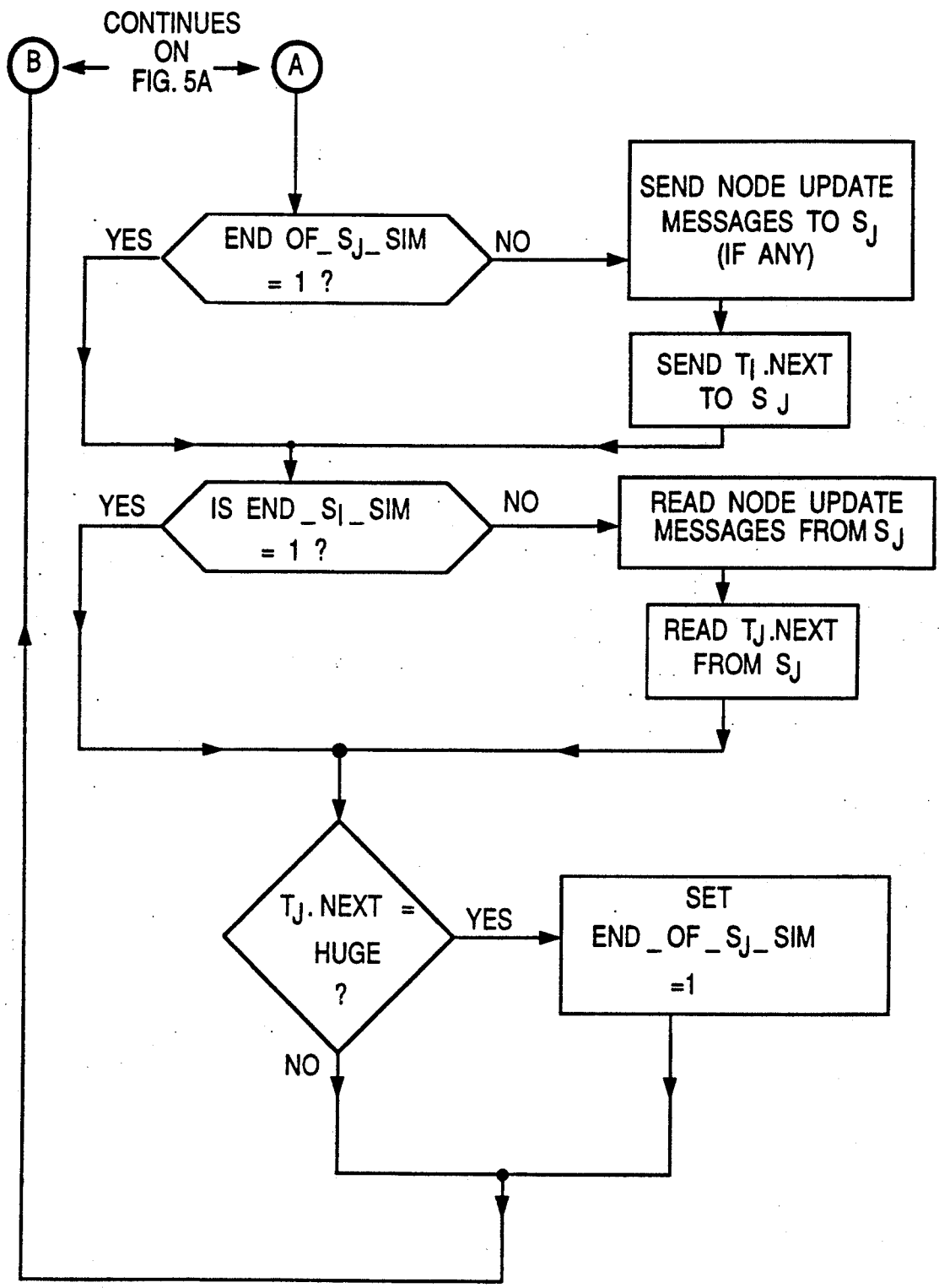

The preferred operational algorithm (flowchart shown in FIGS. 5A and 5B) for a first simulator $S_i$ which is operatively coupled to a second simulator $S_j$ may be defined as follows:

```
Algorithm for Si:
    ti=tj.next=0;
    for(;;) {
        while (ti.current <= tj.next) {
            Process next event in Si queue and update
                ti.current if it changes
            if(end_of_simulation)
                end_of_Si_simulation=1;
        }
        if(end_of_Si_simulation)
            ti.next=HUGE_TIME_VALUE
        else Determine ti.next from the Si event queue
        if(NOT end_of_Sj_simulation) then {
            Send new shared event messages to Sj; if any
            Send the value of ti.next to Sj
        }
        if(NOT end_of_Si_simulation) {
            Read new shared event messages from Sj and/or a
                message containing tj.next
            if(tj.next == HUGE_TIME_VALUE)
                end_of_Sj_simulation = 1;
        }
        else return;
    }
```

The terms in the above algorithm are defined as follows:

| | Definitions: |
|---|---|
| Si: | simulator number i. |
| Sj: | simulator number j. |
| ti.current: | the current simulated time in simulator i. |
| ti.next: | the time of the next scheduled event in simulator j. |
| tj.next: | the time of the next scheduled event in simulator j. |
| end_of_Si_simulation: | a flag indicating that the Si simulation is completed |
| end_of_Sj_simulation: | a flag indicating that the Sj simulation is completed |
| end_of_simulation: | a flag that is set when the overall simulation is either canceled by the user, or when it reaches a prespecified final simulated time. |
| HUGE_TIME_VALUE: | a specific simulated time value used to signal the |

| | -continued |
|---|---|
| | end of simulation. |

Figure 6A:
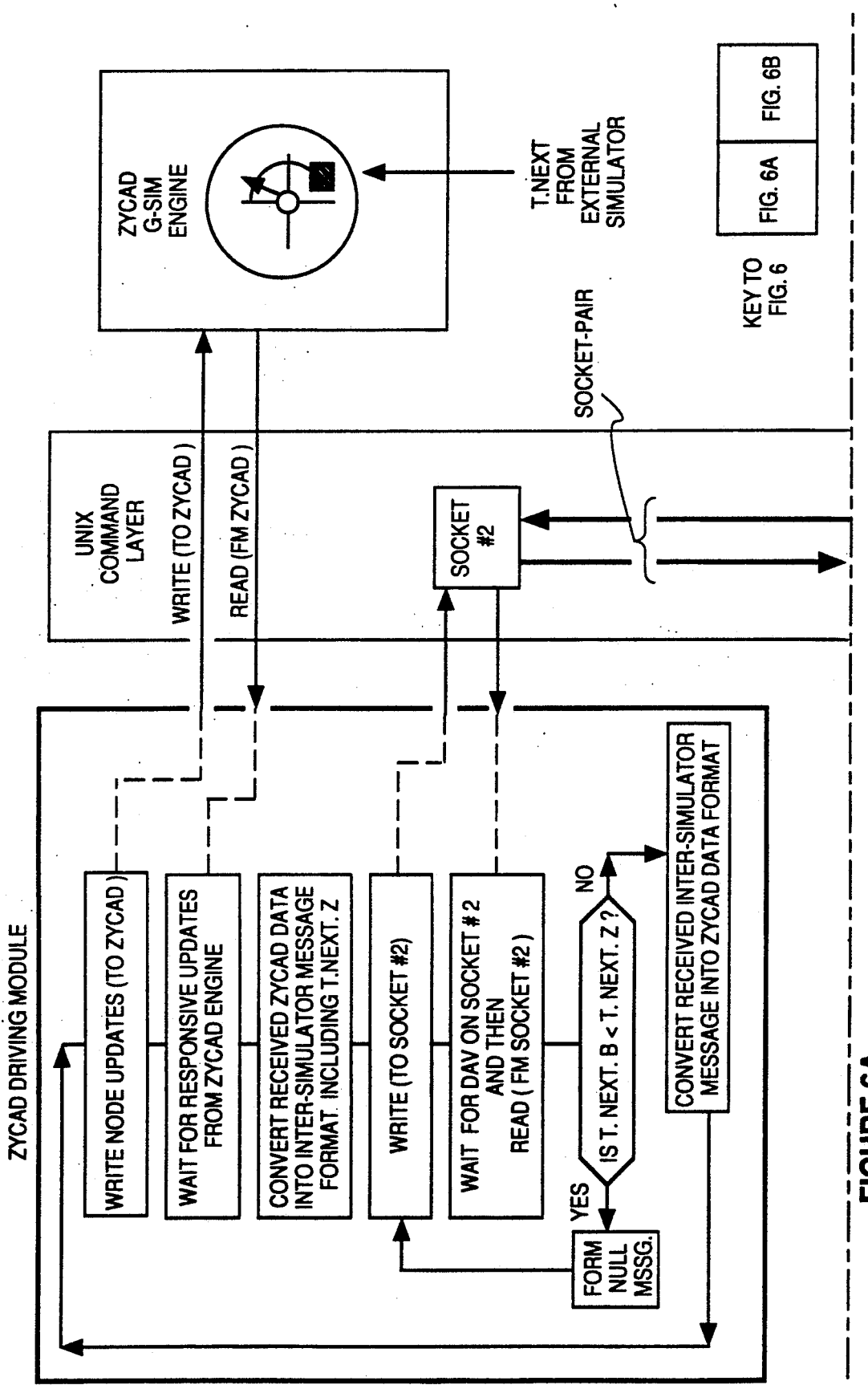
FIG. 6 is a block diagram explaining a UNIX ™ style embodiment of the present invention.
Figure 6B:
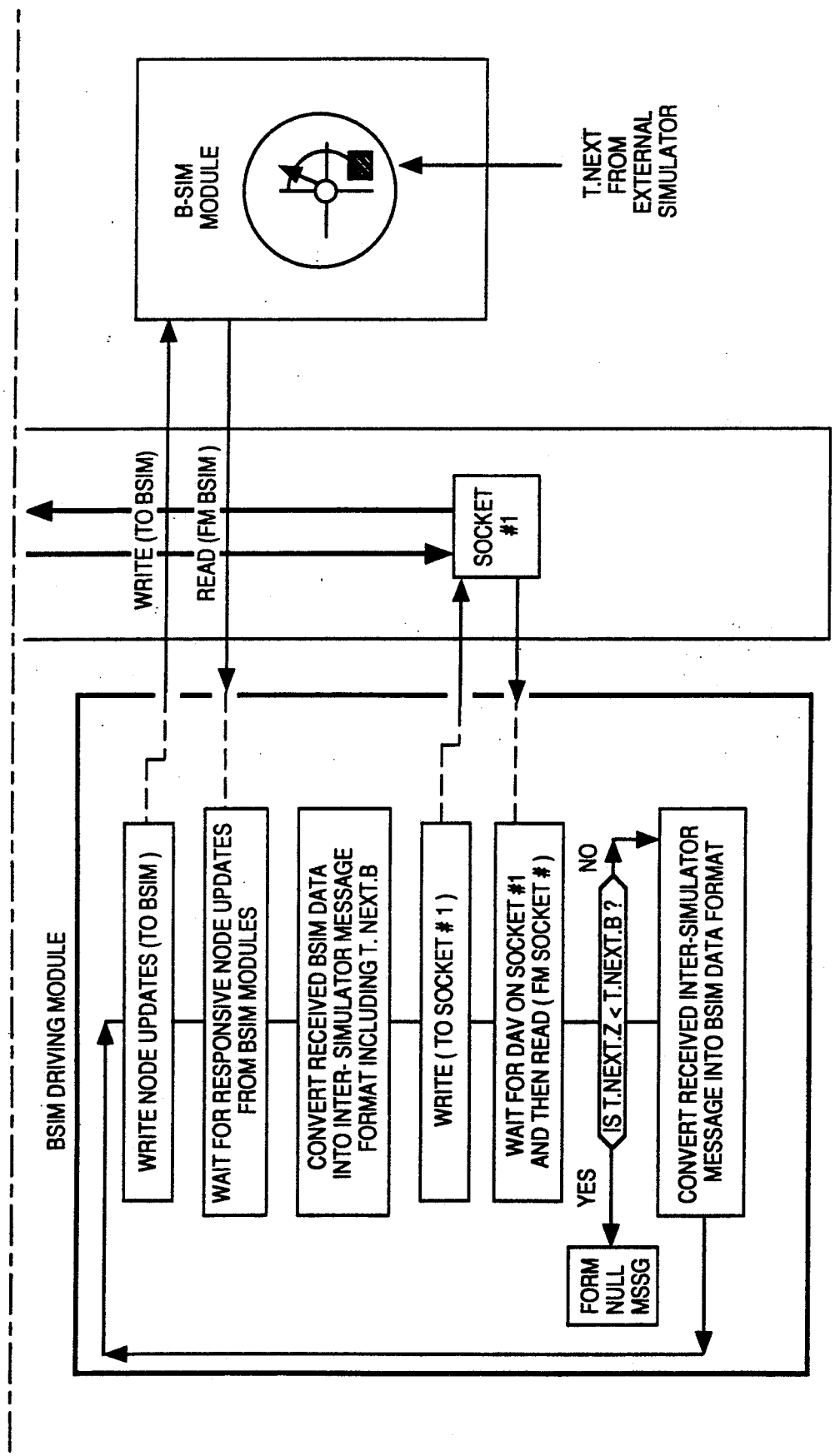

The above described algorithm may be practiced either in a parallel processing environment or a single CPU environment provided with a multitasking operating system. Referring to FIG. 6, there is shown a structure for carrying out the present invention under the UNIX TM operating system. (UNIX TM is a trademark name of an operating system package available from American Telephone & Telegraph Corp.) Interconnection between independent simulators is provided by way of a so-called socket pair connection within the UNIX command layer. The illustrated embodiment comprises a Zycad gate level simulating engine and an LSI Logic BSIM behavioral level simulation module. The driving module for each of the independently clocked simulators includes means for comparing the local next event time against the external next event time. If the local next event time is greater than the external next event time, local simulation is halted and only a null message is transmitted to the external simulator. This allows the external simulator to catch up in simulated time with the local simulator. The time for generating a null message is relatively small, so the catch-up time of the external simulator is not substantially delayed by processing the null message. As seen in FIG. 6, each driving module includes means for converting back and forth from an inter-simulator message format to a local simulation-engine format.

In the UNIX implemented embodiment of FIG. 6, the preferred inter-simulator message syntax is a 4-tuple: (partition, pin-offset, state, schedule-time), where "partition" is a partition number determined from a sigma-file, "pin-offset" is the offset of a specified pin within a module-shell, and "scheduled-time" is the simulated time point at which the specified pin is to change its state to the newly specified "state".

Initial benchmark tests with the above strategy indicate that there is a 15%-20% simulation time penalty for the inter-simulator communication overhead. However, with such a structure it is now possible to interconnect model parts developed on different simulators without having to port a model part definition from one type of simulator to another. The ability to interconnect model parts without having to convert their software definitions for compatibility with a target simulator more than makes up for the communications overhead. The burst speed of the faster simulator is not substantially reduced. An overall reduction in design and development time is expected from use of the above described invention.

Various modifications and additions to the above described invention will, of course, become apparent to those skilled in the art after reading this disclosure; some of the variations being immediately apparent and others becoming apparent after prolonged study of the present disclosure. It should be understood that the above disclosure is merely illustrative of the invention and that, as such, it should not be taken in a limiting sense. The scope of the claimed invention is best defined by reference to the following claims.

What is claimed is:

1. A method for interconnecting first and second model parts whose operations are being respectively simulated in independently clocked first and second simulators comprising:

determining the next point in simulated time at which the first model part can generate a state which could affect the second model part;

transmitting a first value representing the next time point to the second simulator; and blocking the second simulator from simulating an operation in the second model part at a time point later in simulated time than the next time point of the first model part;

determining the next point in simulated time at which the second model part can generate a state which could affect the first model part;

transmitting a second value representative of the next time point of the second model part to the first simulator;

blocking the first simulator from simulating an operation in the first model part at a time point later in simulated time than the next time point of the second model part.

2. The method of claim 1 wherein at least one of the first and second simulators is an event-driven simulator.

3. A system for simulating an interconnection of first and second model parts whose operations are being respectively simulated in independently clocked first and second simulators, comprising:

means for determining a next point in simulated time at which the first model part can generate a state which could affect an operation within the second model part;

communication means, coupled to the determining means and the second simulator, for transmitting a first value representative of the next time point of the first model part to the second simulator;

means for blocking the second simulator from simulating an operation of the second model part occurring at a time point later in simulated time than the next time point of the first model part, said blocking means not blocking the second simulator from simulating operation of the second model part occurring before the next time point of the first model part; and wherein one of the first and second simulators performs simulations faster than the other simulator for a given level of model definition.

4. The system of claim 3 wherein at least one of the first and second simulators is an event-driven simulator.

5. The system of claim 3 wherein the first and second model parts define interconnected parts of a digital system and wherein the level of model definition is selected from the group consisting of a behavioral level, a gate level and a transistor level.

6. The system of claim 3 wherein the first and second simulators are designed to process imcompatible software libraries.

7. A system for modelling the operations of two or more interconnected parts of a model, comprising:

two or more independently clocked simulators each modelling the operations of a respective one of the two or more model parts, wherein each simulator includes:

(a) current time designating means for designating a current point in simulated time at which the operations of its respective model part are being currently simulated;

(b) next time designating means for designating a next point in simulated time at which the operation of its respective model part is scheduled to be next simulated; and (c) transmission means for transmitting to one or more of the other simulators a value representing the next point in simulated time of the transmitting simulator.

8. A system for modelling the operations of two or more interconnected parts of a model, comprising:

two or more independently clocked simulators each modelling the operations of a respective one of the two or more model parts, wherein each simulator includes:

(a) means for designating a current point in simulated time at which the operations of its respective model part are being currently simulated;

(b) designating means for designating a next point in simulated time at which the operation of its respective model part is scheduled to be next simulated; and (c) means for transmitting to one or more of the other simulators a value representing the next point in simulated time of the transmitting simulator;

means for receiving from one or more of the other simulators respective other values representing the next time points of the other simulators; and means for blocking advancement of the current time designating means in the receiving simulator if the next time of the receiving simulator is greater than a next time value received from any one of the other simulators.

9. The system of claim 8 wherein at least one of the simulators is an event-driven simulator having a dynamically updated event queue.

* * * * *

UNITED STATES PATENT AND TRADEMARK OFFICE
CERTIFICATE OF CORRECTION

PATENT NO. : 5,081,601
DATED : January 14, 1992
INVENTOR(S) : Asgeir T. Eiriksson It is certified that error appears in the above-identified patent and that said Letters Patent is hereby corrected as shown below:

On the Title page, item [75], Inventor's name should read-- Ririksson--. and in References Cited section, item [56], "Olnizuka" should read -- Onizuka--.

Signed and Sealed this

Twenty-fifth Day of May, 1993

Attest:

MICHAEL K. KIRK

Attesting Officer

Acting Commissioner of Patents and Trademarks